United States Patent [19]

Jewett

[11] Patent Number: 5,266,151
[45] Date of Patent: Nov. 30, 1993

[54] INSIDE EDGE DEFINED, SELF-FILLING (IESF) DIE FOR CRYSTAL GROWTH

[75] Inventor: David N. Jewett, Harvard, Mass.

[73] Assignee: Advanced Crystal Products Corporation, Woburn, Mass.

[21] Appl. No.: 846,533

[22] Filed: Mar. 4, 1992

[51] Int. Cl.$^5$ ................................ B01D 9/00
[52] U.S. Cl. .................... 156/608; 156/DIG. 65; 156/DIG. 88; 156/DIG. 115
[58] Field of Search ............... 156/600, 608, DIG. 65, 156/DIG. 88, DIG. 115; 422/253

[56] References Cited

U.S. PATENT DOCUMENTS

| | | | |
|---|---|---|---|
| 2,791,813 | 5/1957 | Delano | 156/608 |
| 3,765,843 | 10/1973 | Labelle, Jr. et al. | 156/608 |
| 3,846,082 | 11/1974 | Labelle, Jr. et al. | 156/DIG. 88 |
| 3,853,489 | 12/1974 | Bailey | 156/608 |
| 3,915,662 | 10/1975 | Labelle et al. | 156/608 |

Primary Examiner—Olik Chaudhuri
Assistant Examiner—Felisa Garrett
Attorney, Agent, or Firm—Samuels, Gauthier & Stevens

[57] ABSTRACT

A method and system for growing elongated crystalline materials. Crystalline melt rises through a capillary. At the upper end of the capillary is a die having a die tip. A seed crystal engages and draws the melt through the die tip. The die tip is characterized by a top surface and an aperture therein. The top surface is non-wetting with reference to the crystalline melt. The geometry of the aperture or inner edge defines the geometry of the crystalline filament formed.

7 Claims, 2 Drawing Sheets

INSIDE EDGE DEFINED, SELF-FILLING (IESF) DIE FOR CRYSTAL GROWTH

FIELD OF THE INVENTION

This invention relates to the growth of materials from a melt and more particularly to growth of elongated crystalline bodies of predetermined configuration.

BACKGROUND AND BRIEF SUMMARY OF THE INVENTION

It is recognized that many solid high temperature materials produced in the form of elongated crystalline bodies exhibit properties which, depending upon the configuration of such bodies, render them useful for a wide variety of applications. Elongated single crystal or essentially monocrystalline bodies, in particular filaments, of selected materials such as α-alumina have utility as reinforcement elements for metal, intermetallic and ceramic matrices to provide composite materials useful in fabricating structural parts for jet engines, turbines, etc., as substrates for epitaxially grown integrated circuit devices and as optical components.

Heretofore, as taught in a series of patents issued to LaBelle and others, the elongated crystalline filaments are pulled from a melt by a process called "edge defined film fed growth" (EFG). Briefly described the process involves growth of a selected material in the form of an elongated body with an arbitrary, constant cross-section from a shaping member (or die) having a substantially horizontal surface whose gross geometry with respect to its bounding edges is the same as that of the elongated body to be produced. The shaping member has one or more orifices through which material in a molten state is fed to form on the aforesaid surface a film having the same geometry as the surface. The elongated body is grown from the film by causing the molten material to solidify on a seed body which is withdrawn in a substantially vertical direction at a speed consistent with the rate at which the molten material can be supplied to maintain the film and/or the rate at which liberated heat of solidification can be rejected. The shaping member is made from a material which is compatible with the liquid and solid phases of the material to be grown and which is wetted by the material. The shaping member is disposed in a reservoir supply of the material in the molten state and each orifice is dimensioned so that the surface tension forces are sufficient to cause continuous feeding of the material from the reservoir supply by capillarity. By proper adjustment of the melt temperature and the rate of seed withdrawal, a crystalline body having the same cross-sectional geometry as the surface of the shaping member can be produced on a continuous basis so long as the liquid material continues to be supplied at a rate sufficient to maintain the film between the shaping member and the growing body and sustain the desired growth rate.

However, for small diameter filaments useful for metal matrix composites, e.g. titanium matrix, YAG fiber composites and especially for very small diameter filaments useful for ceramic matrix composites, e.g. alumina matrix, alumina fiber, the fabrication of the die used in EFG becomes very difficult.

In EFG crystal growth the die capillary is filled by capillary action and upon seeding, the melt spreads out over the top surface of the die and the diameter of the grown crystal filament is controlled by the outside diameter of the top surface of the die. The capillary and top surface are formed of wetting materials. (Boatman, a United States Patent, teaches an entirely non-wetting die). With very small filament dies, the top surface of the die tends to be very small, approaching an edge. In this situation, however, the die (tungsten or molybdenum) is so thin that seepage of the crystalline melt, e.g. sapphire, through the grain boundaries tends to produce spilling and wetting down the outer surfaces of the side walls of the die tip. This produces a larger diameter filament than desired and also an undesired solid—liquid interface shape.

Accordingly, an object of this invention is to provide a new method and system by which solid crystalline materials can be pulled from a melt as elongated crystalline bodies of indefinite lengths and predetermined cross-sectional configurations especially materials of small cross-section such as filaments.

A further object is to provide a method and a system whereby elongated bodies of solid materials may be grown from a melt to various arbitrary shapes and sizes with smooth surfaces.

Another still further object of this invention is to provide a method and a system by which congruently melting solid materials may be continuously pulled from a melt in the form of crystalline bodies of controlled cross-sectional configurations.

A still further object of this invention is to provide a novel method and a system for growing from the melt elongated single crystal, essentially monocrystalline, and polycrystalline bodies of indefinite length and predetermined cross-sectional configuration.

A still further object is to produce elongated crystalline bodies of the character described by a growth process in which the melt temperature and pulling speeds may be varied over relatively wide limits without effecting any substantial change in product cross-section.

A specific object of this invention is to grow from melts of selected material extended crystalline bodies characterized by a variety of predetermined cross-sectional configurations, including but not limited to round filaments, flat ribbons, round hollow tubes, etc.

The foregoing and other objects and advantages of the invention are embodied by what is hereinafter referred to as an "inside edge defined, self-filling" (IESF) die, the method of using the die and the system in which the die is embodied.

Broadly, the invention comprises a die tip, the top and outer surfaces being characterized by a non-wetting material, such as boron nitride or the carbides of molybdenum or tungsten. This die tip achieves a major improvement in crystal growth particularly for small diameter filaments.

With the invention, the die is still filled to the top by capillary action as in EFG.

However, the diameter of the filament is controlled by the inner surface of the non-wetting material which is typically the inside diameter of the die tip. Converting the outside of the die walls to the non-wetting composition stops the intergranular seepages or leaking and wetting of the die.

Die fabrication is much more practical.
 a. In EFG, a die used to produce 0.003" diameter filament would have an OD of about 0.003" and an ID of about 0.001".
 b. This EFG die is a very fragile and difficult to fabricate structure.

c. Even if adequately made, the top edge of the EFG die would tend to be rounded and lead to a wide variety of diameter filaments grown from the die top. In other words, diameter control would not be particularly good.
d. The IESF die for the same 0.003" diameter filament could be 0.006" OD and 0.003" ID.
e. The IESF die is a comparably robust structure and much easier to produce.
f. The IESF die top can be flat and rounding of the outside surface edge is of no consequence. In fact the outer wall can be tapered to produce even more strength without promoting spilling or wetting of the liquid crystalline down the outer surface.
g. Diameter control of the IESF die is greatly increased with little variation of the filament diameter with variations of growth parameters.

Broadly the invention comprises a die used in combination with an apparatus for growing crystalline filament. The die is in communication with a capillary through which rises a crystalline melt. The die has an upper surface having an aperture through which the melt is drawn. The aperture is defined by an inner edge. The upper surface of the die tip is non-wetting with reference to the melt. The geometry of the melt drawn through the die is defined by the inner edge.

DESCRIPTION OF THE PREFERRED EMBODIMENT(S)

While the following detailed description and several examples of the invention are directed to growth of extended crystalline bodies of α-alumina, barium titaniate, lithium niobate, yttrium aluminum garnet, and yittria, it is to be appreciated that the invention is also applicable to other materials, including but not limited to materials that melt congruently (i.e., compounds that melt to a liquid of the same composition at an invariant temperature).

Figure 1:
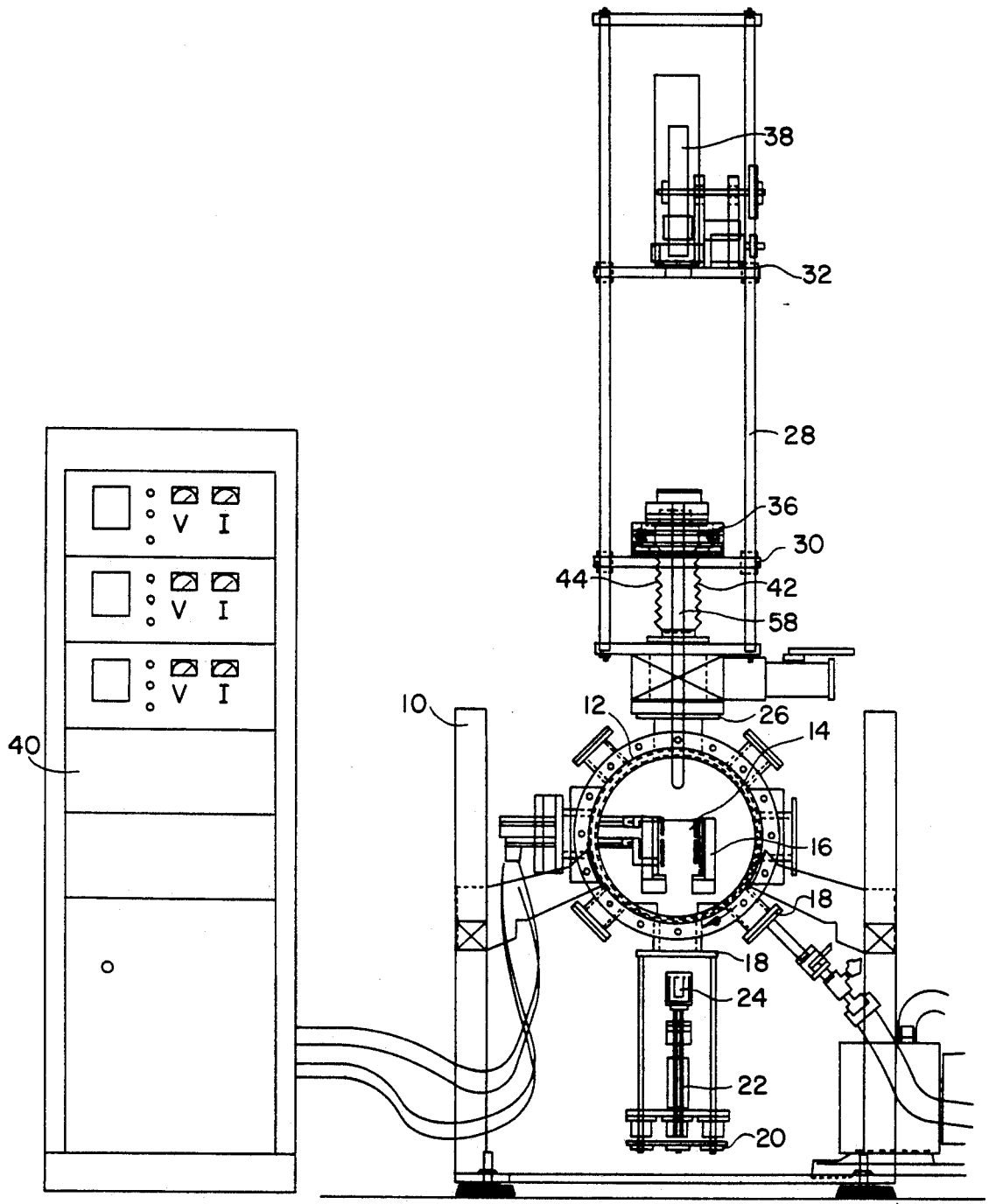
FIG. 1 is an elevational view, partly in section of one form of furnace that may be employed in the practice of the invention.

Referring to FIG. 1, a system embodying the invention is shown generally and comprises a frame 10 on which is supported a water cooled, stainless steel furnace chamber 12 of a type known to those skilled in the art. Heating is provided by a cylindrical resistance heater 14 surrounded by an insulation package 16. On the lower part 18 of the chamber is supported a frame 20 and a movable pedestal 22 which supports a crucible and die set 24. This is shown in its lowered position for clarity. In use, it is raised and positioned inside the heating element 14. The upper part 26 of the chamber supports a frame 28. This frame in turn supports two vertically movable horizontal plates 30 and 32. The plate 30 supports an XY positioning table on which is mounted a rectangular cross-section guide 34 containing longitudinal slots to hold the crystalline seeds and to pull up the elongated crystalline bodies. This is surrounded by a rubber boot 36. The plate 32 supports a wheel puller mechanism 38, as known to one skilled in the art. Power to the heating element is provided by a low voltage 25 KW AC electrical power supply 40. As known to one skilled in the art, such a furnace will be constantly purged with an inert gas, such as argon, fed through any of the chamber's side ports 42 and bled out through an opening 44 near the top of the rubber boot.

Figure 2:
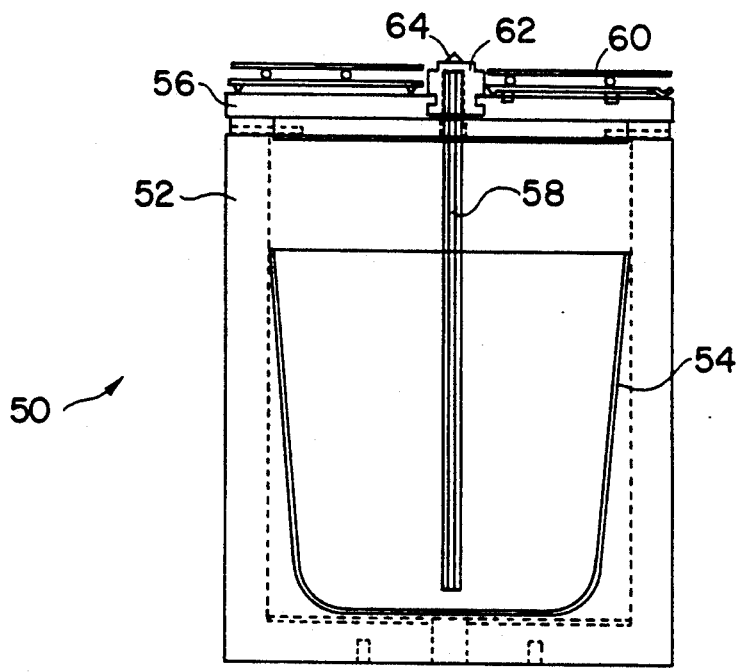
FIG. 2 is a sectional view in elevation of a crucible-forming member arrangement for growing round filaments.

Referring now to FIG. 2, there is shown a structure 50 adapted for growing filaments of substantially circular cross-section. The structure 50 comprises a crucible holder 52 made from molybdenum or tungsten inside which sits a thin wall crucible 54 made from tungsten. The crucible holder 52 is fitted with a cover 56 into which is inserted a capillary 58. Items 54-58 are usually made from the same material which can be either molybdenum or tungsten. Radiation shields 60 of tungsten or molybdenum are placed above the crucible holder 52, crucible 54 and cover 50. A die of tungsten or molybdenum is secured to the upper end of the capillary 58 and includes a die tip 64 shown in greater detail in FIG. 3.

The dimensions of crucible may be varied over a relatively wide range according to the size and heating capability of the furnace and the size and length of the filament to be produced. Nevertheless, it is essential that the axial bore within the capillary (or equivalent melt delivery passageways in the other embodiments) be sized so that the melt material can rise therein by capillary action up to its top end, so as to permit establishing and maintaining a growth pool of melt on the upper end surface of the rod in the manner herein described.

Figure 3:
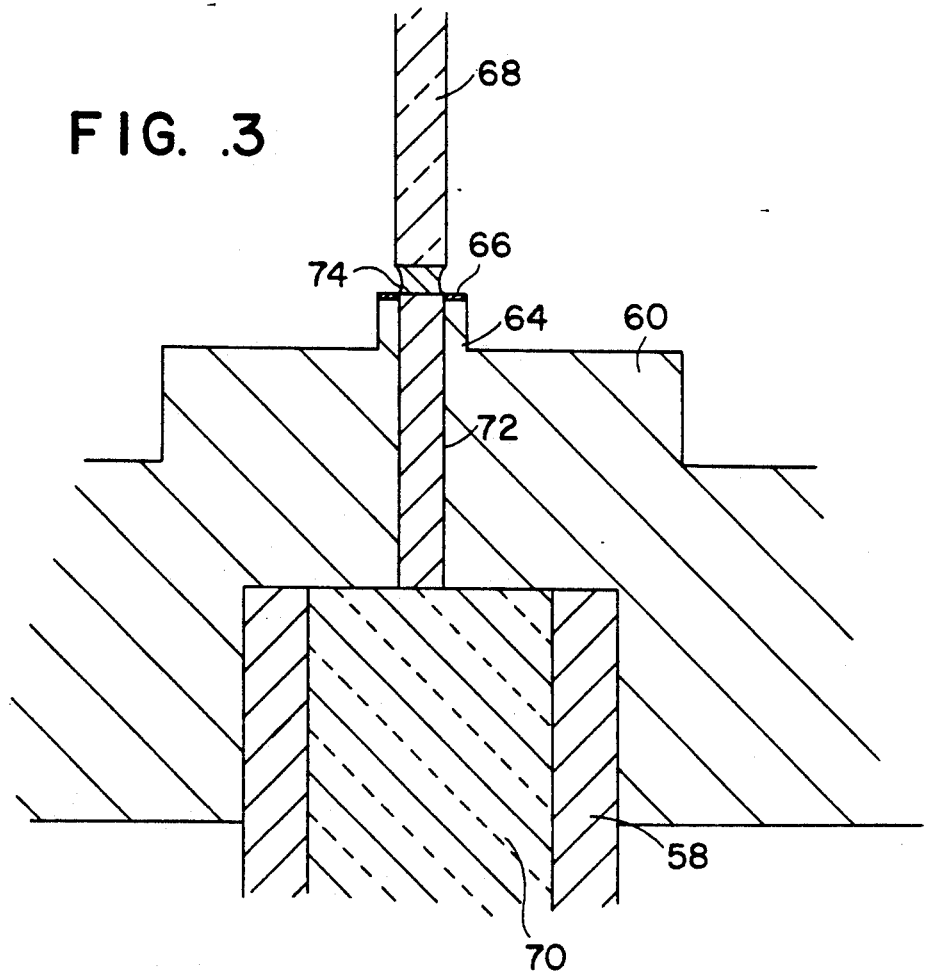
FIG. 3 is an enlarged schematic view showing growth of the filament.

Referring to FIG. 3, the top surface 66 of the die tip 64 is treated in such a manner that it is non-wetting or poorly wetted by the molten substance being pulled into the elongated crystalline material. In our experience, it appears that boron nitride, tungsten carbide, molybdenum carbide are either non-wetting or poorly wetted by a liquid alumina in argon atmosphere or vacuum. These and similar non-wetting materials can be applied where desired on the metal die tip by chemical vapor deposition or other techniques. The thickness of the coating can vary from 1 to 100 microns more or less.

After such treatment, contact with molten sapphire shows a non-wetting, characteristic shaped droplets. A useful tool in evaluating the coating is to check with wetting by water since water also wets the coating poorly and the metal well.

Operation of the apparatus shown in FIGS. 1 and 2 and a specific example of the method of growing α-alumina filaments according to my invention will now be described with further reference to FIG. 3. Positioned in the furnace in the manner described above is a molybdenum crucible holder having an internal diameter of about 2 ½ inch, a wall thickness of about ¼ inch, and an internal depth of about 3 inch. The crucible is fitted with a molybdenum cover measuring about ¼ inch thick and having a center slot of about ⅜" width. Disposed in the crucible is a shaping member (die and capillary) 58 and 62 constructed generally as shown in FIG. 2. The crucible is filled with substantially pure polycrystalline α-alumina and an α-alumina seed crystal filament 68 is mounted in the wheel puller 38 so that its c-axis is aligned parallel to the holder's path of movement. The lower end of the seed crystal is sufficiently small in cross-section to be inserted into the upper end of the guide 14.

The crucible is disposed so that the die 60 is in line with the seed crystal and also so that its top surface 66 extends at a right angle with reference to the seed crystal's c-axis. With the crucible assembly 50 inserted into the furnace, cooling water is introduced between the furnace chamber walls and the enclosure is evacuated and filled with argon to a pressure of about one atmosphere which is maintained during the growth period. Then the resistance heater 14 is energized and operated so that the alumina is brought to a molten condition (alumina has a melting point in the vicinity of 2000° C.). The melt is shown at 70. As the alumina is converted to a liquid, a column (see FIG. 3) of molten alumina will rise in and fill capillary 58 the die lid capillary 72. The column will rise until its meniscus is substantially flush with the top surface of the die tip.

After affording time for temperature equilibrium to be established, the pulling mechanism is actuated and operated so that the seed crystal 68 is moved into contact with the meniscus of the column of alumina in capillary 72, allowed to rest there for about 5 seconds, and then withdrawn slowly, e.g., at a rate of about one half to one inch per minute. The temperature of the melt in capillary 78 is critical. If it is too cold, the portion in the upper end of capillary 78 will tend to solidify and no growth will occur on the seed crystal. If the melt is too hot, it will cause the seed to melt. Hence the initial withdrawal of the seed may be unaccompanied with any crystal growth. Accordingly, the rate of heating the melt is adjusted (increased or decreased depending upon whether the film is too cold or too hot) and then the seed is again brought into contact with the column of melt, held there for about five seconds, and then withdrawn again at the aforementioned rate. Attainment of the proper melt temperature is revealed by commencement of crystal growth on the end of the relatively cooler seed. Normally as the seed continues to be withdrawn slowly, the non-wetting surface 66 of the die tip 64 inhibits the melt from spreading to the outside diameter of tip 64. The crystal solid-liquid interface geometry is thus defined by the inside edge 74 of die tip 64.

At the aforesaid pulling speed growth will propagate vertically throughout the entire horizontal expanse of the melt column, with the result that the diameter of the growing round crystalling body will be substantially the same as that of the inside edge 74 of die tip 64. As growth continues, the pulling speed and rate of heating are adjusted to and held at levels consistent with optimum growth. In practice, the pulling speed is adjusted to about 1-3 inches/minute. The growing filament has a circular symmetry with an O.D. substantially the same as that of the inside edge of die tip 36 at the temperature of growth, and its maximum length using the continuous pulling mechanism 16 limited only distance afforded by the by the available supply of molten alumina.

It is to be understood that the invention is not limited in its application to the details and apparatus and method specifically described or illustrated, and that within the scope of the appended claims, it may be practiced otherwise than as specifically described or illustrated.

Having described our invention, what we now claim is:

1. In a method for growing crystalline filament where a seed crystal engages a melt which melt rises through a capillary and engages the seed crystal and is drawn from the capillary, the improvement which includes:
   drawing the melt through a die tip, the die tip having an aperture defined by an inner edge of a non-wetting top surface, the inner edge of the die tip defining the outside geometry of the crystalline filament, the non-wetting top surface inhibiting the spread of the melt to the outside diameter of the die tip.

2. The method of claim 1 wherein the die tip has a top surface which top surface is non-wetting with reference to the crystalline melt.

3. The method of claim 1 which includes:
   drawing the melt through the aperture at a rate and a temperature to ensure that the melt solidifies in the shape of the inner edge.

4. The method of claim 1 wherein the melt crystallizes in a rhombohedral, hexagonal, cubic or tetragonal lattice structure.

5. The method of claim 1 wherein the inner edge of the die defines a circular aperture.

6. The method of claim 1 wherein the inner edge of the die defines a non-circular aperture.

7. The method of claim 1 wherein the solidified body is essentially monocrystalline.

* * * * *